United States Patent [19]
Maruyama

[11] Patent Number: 5,426,611
[45] Date of Patent: Jun. 20, 1995

[54] NON-VOLATILE SEMICONDUCTOR DEVICE

[75] Inventor: Akira Maruyama, Suwa, Japan

[73] Assignee: Seiko Epson Corporation, Tokyo, Japan

[21] Appl. No.: 267,294

[22] Filed: Jun. 29, 1994

Related U.S. Application Data

[63] Continuation of Ser. No. 55,308, May 3, 1993, abandoned.

[30] Foreign Application Priority Data

May 8, 1992 [JP] Japan .................. 4-115824
Apr. 27, 1993 [JP] Japan .................. 5-123442

[51] Int. Cl.6 .............................................. G11C 13/00
[52] U.S. Cl. ..................... 365/218; 365/185; 365/900
[58] Field of Search ............ 365/189.01, 230.01, 365/218, 185, 900

[56] References Cited

U.S. PATENT DOCUMENTS 4,949,309 8/1990 Rao .
5,185,718 2/1993 Rinerson et al. .
5,241,507 8/1993 Fong .
5,247,346 9/1993 Hazani .................. 365/185
5,247,478 9/1993 Gupta et al. .......... 365/185
5,274,599 12/1993 Ema .
5,287,317 2/1994 Kobayashi et al. .

FOREIGN PATENT DOCUMENTS 1-259556 10/1989 Japan .
3-230397 10/1991 Japan .
4-275457 10/1992 Japan .

Primary Examiner—Terrell W. Fears
Attorney, Agent, or Firm—Oliff & Berridge

[57] ABSTRACT

When each of memory transistors 1–4 is to be selected for erasure, word lines WL1 and WL2 are set at GND level, source lines SL1 and SL2 are set at high-potential level, and bit lines BL1 and BL2 are set at open level. On selection of the memory transistors for nonerasure, the word lines WL1 and WL2 are set at high-potential level, the source lines SL1 and SL2 are set at open level and the bit lines BL1 and BL2 are set at open level. The selection is carried out by switching word line signals. The erase operation can be stopped by detecting the threshold voltage in the memory transistors 1–4. After the erase operation has been stopped, the threshold voltage in the memory transistors can be monitored and verified.

16 Claims, 13 Drawing Sheets

NON-VOLATILE SEMICONDUCTOR DEVICE

This is a continuation of application Ser. No. 08/055,308 filed May 3, 1993, now abandoned.

BACKGROUND OF THE INVENTION

1. Field of the Invention

The present invention relates to a non-volatile semiconductor device and particularly to an erasing circuit in a flash (entire array erasure type) EEPROM.

2. Description of the Related Art

Referring to FIG. 11, there is shown the circuit of a flash EEPROM constructed in accordance with the prior art. For simplification, the circuit is shown to comprise eight memory transistors. Actually, such a memory section is formed by a matrix in which a desired number of memory transistors are arranged. As shown in FIG. 13, if the memory section is of a large capacity, for example, equal to 256 Kbits, it is divided into blocks 135–138 each of which is equal to 64 Kbits. Blocks 139 and 140 each comprising X-decoder and other components are arranged between the divided blocks.

The circuit of the prior art shown in FIG. 11 comprises the memory transistors 1–8 and Nch and Pch transistors 205, 206 which are connected to the source areas of the memory transistors 1–8 through a source line SL. The gate electrodes of the transistors 205 and 206 receive an erase signal through an interface 223 and inverter 230. The interface 223 functions to convert the fluctuation of input voltage of Vdd-GND into the fluctuation of output voltage of Vpp-GND.

The control electrodes of the memory transistors 1–8 are connected to word lines WL1, WL2, WL3 and WL4, respectively. The drain areas of the memory transistors 1–8 are connected to bit lines BL1 and BL2.

An address signal is inputted into X- and Y-decoders 118, 94 through an address buffer 92. The X-decoder 118 then generates an X-decoder signal which is inputted into an interface 116. The interface 116 converts the fluctuation of input voltage of Vdd-GND of X-decoder signal into the fluctuation of output voltage of Vpp-GND, and a word line signal for the word line WL1-WL4 is generated. The Y-decoder 94 generates a Y-decoder signal which in turn is sent to a write and erase control circuit 119 and sense amplifier 96.

The write and erase control circuit 119 is controlled by the Y-decoder signal with respect to the write of data. More particularly, data inputted through a data buffer 98 is written in the memory transistors 1–8 by the write and erase control circuit 119 using the Y-decoder signal as an address. The write and erase control circuit 119 further controls to erase the data stored in the memory transistors 1–8.

The sense amplifier 96 reads out the data from the memory transistors 1–8 using the Y-decoder signal as an address. The data read out is outputted through the data buffer 98 as a data signal.

The circuit of the prior art will be described in more detail with reference to the potential diagram of FIG. 12.

First of all, the write operation will be described. When the write is to be made to the memory transistor 1, WL1 and BL1 are placed at high potential Vpp level while WL2, WL3, WL4 and BL2 are placed at GND level, as shown in FIG. 12. By further placing the erase signal at L, level (lower logical invert level), the Nch transistor 205 is turned on and the Pch transistor 206 is turned off. Thus, the source line SL is placed at GND level to generate a channel current in the memory transistor 1. As a result, hot electrons are produced at the drain area end of the memory transistor 1. By injecting the electrons into the floating gate electrode, the write will be carried out. At this time, the write will not be made in the other memory transistors 2–8 since no channel current is generated therein.

Next, the erase will be described. When the erase is to be made, WL1, WL2, WL3 and WL4 are placed at GND level while BL1 and BL2 are placed at open level, as shown in FIG. 12. By further placing the erase signal at H level (upper logical invert level), the Nch transistor 205 is turned off and the Pch transistor 206 is turned on. Thus, the source line SL is placed at Vpp level to generate a tunnel current between the floating gate electrode of each of the memory transistors 1–8 and its associated source area. As a result, electrons are released from the floating gate electrode to the associated source area to perform the erase operation.

When the erase operation is to be carried out in the memory transistors 1–8, the common source line is used and all the word lines are placed at GND level. Therefore, the prior art could perform only the simultaneous erasure of all the memory transistors, that is, entire array erasure. Even if the memory part is divided into blocks as shown in FIG. 13, the common source line is used through each of the divided blocks 135–138. Therefore, the erasure could be made only for each block at a time, for example, for every 64 Kbits (512×128 bits). For instance, Japanese Patent Application Laid-Open No. 3-230397 carries out the erase operation in a block manner.

The flash EEPROM is characterized by that it is non-volatile, writable and higher in capacity. Attention is paid to the flash EEPROM as a memory that can be used in place of magnetic disc, hard disc and the like. However, the flash EEPROM of the prior art is disadvantageous in that it can be erased only in the entire manner or for each block at a time. On the contrary, the hard disc or the like performs the write and erase of data for every 512 bytes in connection with the operating system of a computer. The replacement of the hard disc or the like requires a flash EEPROM that can perform the erasure for less bytes at a time.

The flash EEPROM or the prior art that can perform only the entire array erasure or block erasure has another problem in that an excess current flows on the erase operation. More particularly, if an excess current flows between the source and the substrate due to the entire array erasure, a so-called band-to-band tunneling will be generated to raise various problems such as change of threshold voltage Vth, degradation of endurance, degradation or data retention and so on.

The entire array erasure or block erasure raises a further problem in that the threshold voltage of the memory transistor can be fluctuated over very increased range after the erase operation. More particularly, since the erase operation is carried out by generating the tunnel current between the floating gate electrode and its associated source area as described, the variability from one memory transistor to another becomes larger. As the number of memory transistors to be erased at a time increases, the dispersion of threshold voltage distribution in one chip increases correspondingly. Particularly, if even one memory transistor in the chip is overerased and depleted by the distribution of threshold voltage after the erasure, a leak current will flow in a bit line connected to that memory transistor. As a result, the read-out operation may fail on reading a memory transistor connected to the bit line.

SUMMARY OF THE INVENTION

It is therefore an object of the present invention to provide a non-volatile semiconductor device which can cause memory transistors to have the selectivity of electron release (e.g. erasure).

Another object of the present invention is to provide a non-volatile semiconductor device which can prevent an excess electron release (e.g. overerasing) to reduce the distribution of threshold voltage in a memory transistor after electron release (e.g. erasure).

To this end, the present invention provides a non-volatile semiconductor device comprising a plurality of memory transistors arranged in a matrix, each of said memory transistors including a floating gate electrode, a control gate electrode and first and second diffusion layers and being adapted to store data depending on the injection and release of electrons to said floating gate electrode, the first, second diffusion layers and control gate electrodes in each of said memory transistors being respectively connected to first, second lines and word line, and means for applying a potential higher than the potential at the control gate electrode of a memory transistor selected from said memory transistors on the electron release to the first diffusion layer of the same memory transistor, the selection of a memory transistor to which the higher potential is to be applied by said applying means being carried out by switching the word line signal in said memory transistor.

In the non-volatile semiconductor device of the present invention, a tunnel current is generated in the selected memory transistor on the electron release (e.g. erasure) since the higher potential is applied to the first diffusion layer (e.g. source area). On the other hand, no tunnel current will not be generated in any other non-selected memory transistor since the higher potential is not applied to its source area. Such a selection is carried out by switching the word line signal.

According to the present invention, the erase operation as well as the read-out operation can be made only to any memory transistor selected by the switching of word line signal. Therefore, the erase operation, which could be carried out by the prior art only in the entire or block manner, can be performed for one or more word lines at a time. In addition, the switching of word line signal to perform the selection of memory transistor can provide a very simplified arrangement with less transistors.

The present invention also provides a non-volatile semiconductor device comprising a plurality of memory transistors arranged in a matrix, each of said memory transistors including a floating gate electrode, a control gate electrode and first and second diffusion layers and being adapted to store data depending on the injection and release of electrons to said floating gate electrode, the first, second diffusion layers and control gate electrodes in each of said memory transistors being respectively connected to first, second lines and word line, means for applying, on electron release, a potential higher than the potential at the control gate electrode of a memory transistor selected by switching a word line signal or a decoder signal for generating the word line signal to the first diffusion layer of the same memory transistor, means for applying a predetermined potential to the control gate electrode of said selected memory transistor, and means for detecting the threshold voltage of said selected memory transistor, whereby the detection of said threshold voltage can stop the electron release.

In the non-volatile semiconductor device of the present invention, the erase operation can be stopped by detecting the threshold voltage of a memory transistor selected by the switching of the word line signal or decoder signal when the electron release (e.g. erasure) is carried out in the selected memory transistor.

According to the present invention, thus, the erasure can not only be carried out within a range including one or more word lines at a time, but also be stopped with respect to all the memory transistors included in said range by detecting the threshold voltage of the memory transistors. Consequently, the overerasing can effectively be avoided and the dispersion of threshold voltage distribution can be suppressed to very low level, in comparison with the prior art wherein the erasure is carried out in the entire or block manner.

It is desirable that said means for detecting the threshold voltage is adapted to apply a potential lower than the potential at the control gate electrode of the memory transistor to the second diffusion layer (e.g. source area) of the same memory transistor.

In such a desired structure of said means for detecting the threshold voltage, the potential or the drain area is lowered by the potential applied to the source area when the memory transistor is reduced in threshold voltage and turned on by the erase operation. This will stop the erase operation. Such an arrangement provides very simplified detector structure with less transistors which can operate with an improved sensitivity and at a higher speed.

The present invention further provides a non-volatile semiconductor device comprising a plurality of memory transistors arranged in a matrix, each of said memory transistors including a floating gate electrode, a control gate electrode and first and second diffusion layers and being adapted to store data depending on the injection and release of electrons to said floating gate electrode, the first, second diffusion layers and control gate electrodes in each of said memory transistors being respectively connected to first, second lines and word line, means for applying, on electron release, a potential higher than the potential at the control gate electrode of a memory transistor selected by switching a word line signal or a decoder signal for generating the word line signal to the first diffusion layer of the same memory transistor, and verifying means for monitoring the threshold voltage of said memory transistor after the electron release.

In such an arrangement, the threshold voltage of the memory transistor selected by switching the word line signal or decoder signal can be monitored and verified after the electron release (e.g. erasure).

According to the present invention, thus, the erasure can be carried out within a range including one or more word lines at a time, and the threshold voltage of all the memory transistors included in said range can be monitored and verified to be detected after the erase operation. Consequently, the overerasing can effectively be avoided and the dispersion of threshold voltage distribution can be suppressed to very low level, in comparison with the prior art wherein the erasure is carried out in the entire or block manner.

DETAILED DESCRIPTION OF PREFERRED EMBODIMENTS

(1) First Embodiment

Figure 1:
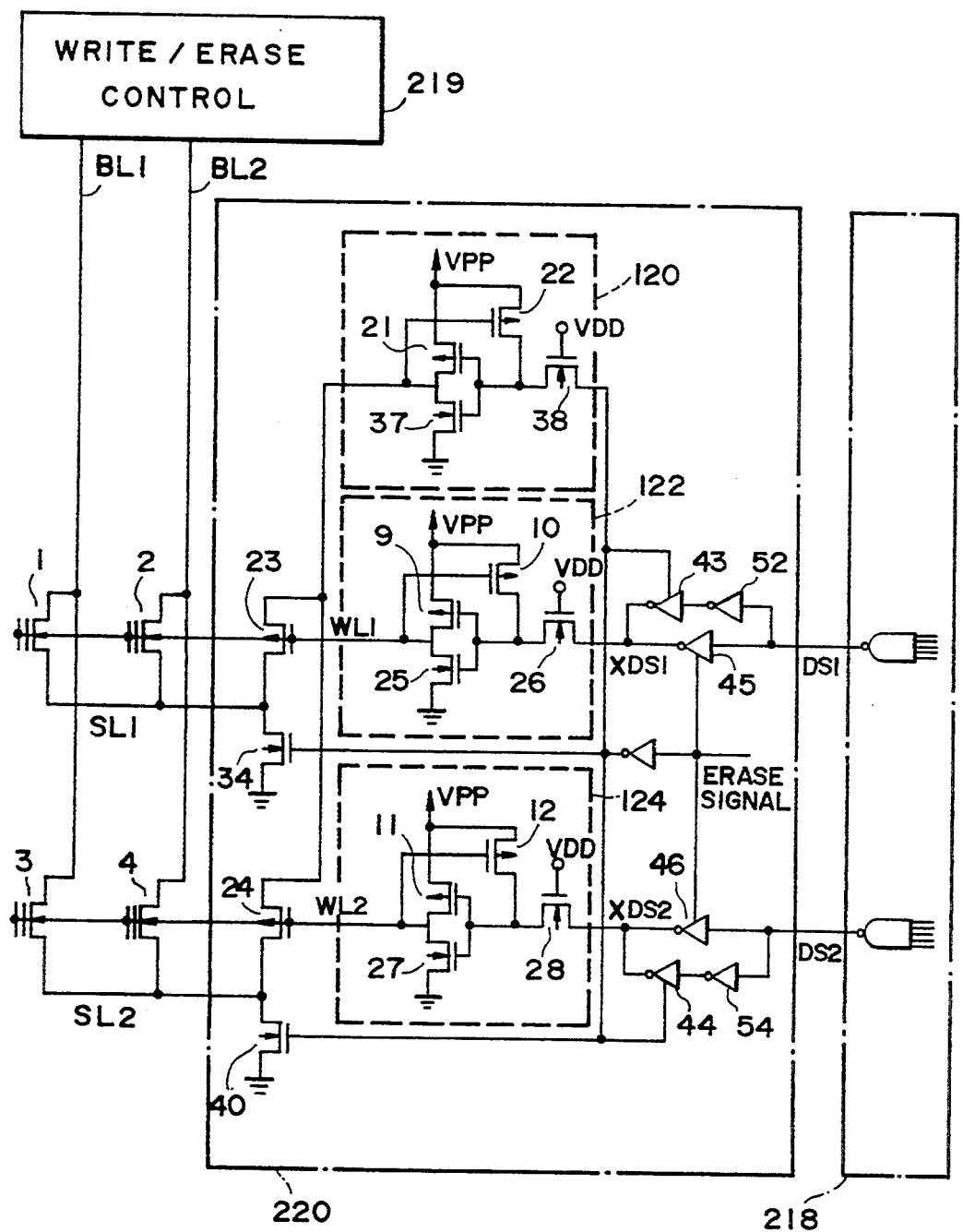
FIG. 1 is a circuit diagram of the first embodiment of a non-volatile semiconductor device constructed in accordance with the present invention.

Referring to FIG. 1, there is shown the first embodiment of a non-volatile semiconductor device constructed in accordance with the present invention. For simplification, the non-volatile semiconductor device is shown to include four memory transistors 1-4. In practice, however, the memory part is defined by a matrix in which a desired number of memory transistors are arranged.

In addition to the four memory transistors 1-4, the first embodiment comprises an X-decoder circuit 218, a write/erase control circuit 219 and a word line control circuit 220.

The write/erase control circuit 219 controls the write/erase operation to the memory transistors 1-4 through bit lines BL1 and BL2 which are respectively connected to the second diffusion layers (e.g. drain areas) of the memory transistors 1-4.

The X-decoder circuit 218 decodes an address signal inputted through an address buffer to generate decoder signals DS1 and DS2. The decoder signals DS1 and DS2 are then sent to the word line control circuit 220.

The word line control circuit 220 is responsive to decoder signals DS1, DS2 and erase signal to control word lines WL1, WL2 and source lines SL1, SL2. The word lines WL1 and WL2 are connected to the respective control gates of the memory transistors 1-4 while the source lines SL1 and SL2 are connected to the respective first diffusion layers (e.g. source areas) of the memory transistors 1-4.

The word line control circuit 220 includes a circuit comprising an inverter 52 and clock gate type inverters 43, 45 and another circuit comprising an inverter 54 and clock gate type inverters 44, 46, all of which circuits generate signals XDS1 and XDS2. The signals XDS1 and XDS2 are generated by inverting or non-inverting the decoder signals DS1, DS2 on selection by the erase signal.

The word line control circuit 220 further includes interface circuits 120, 122 and 124 each of which comprises transistors (21, 22, 37, 38: 9, 10, 25, 26; 11, 12, 27, 28). Each of the interface circuits 120, 122 and 124 functions to convert the fluctuation of input voltage of Vdd-GND into the fluctuation of output voltage of Vpp-GND. Thus, the interface circuits 122 and 124 modify the fluctuation of input voltage of the signals XDS1 and XDS2 to generate word line signals which in turn are applied to the word lines WL1 and WL2, respectively. The interface circuit 120 modify the fluctuation of input voltage of the inverted erase signal to provide a power supply for switching circuits each of which comprises transistors (23, 34: 24, 40).

The write operation or the first embodiment will be described with reference to FIG. 2.

Figure 2:
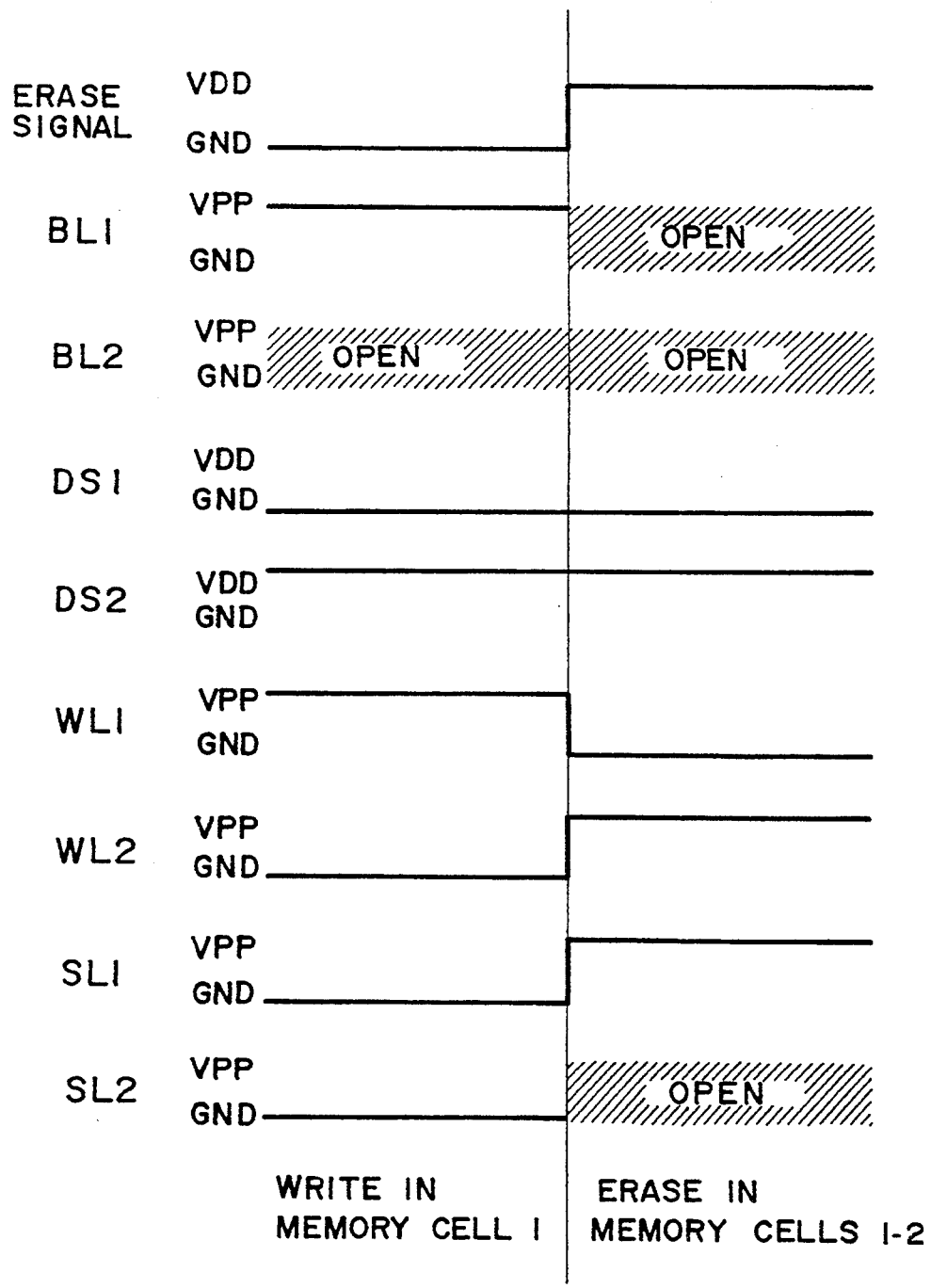
FIG. 2 is a potential diagram illustrating the operation of the first embodiment.

As shown in FIG. 2, the write operation requires that the erase signal is set at L level. Thus, Nch transistors 84 and 40 are turned on to place the source lines SL1 and SL2 at GND level. Further, the clock gate type inverters 43 and 44 are turned on while the inverters 45 and 46 are turned off. When the write operation is to be carried out relative to the memory transistor 1 in such a condition, the X-decoder circuit 218 respectively places the decoder signals DS1 and DS2 at L and H levels, as shown in FIG. 2. As a result, the word lines WL1 and WL2 will respectively be set at Vpp and GND levels since the clock gate type inverters 43 and 44 are in their ON state, as shown in FIG. 2. Further more, the write/erase control circuit 219 sets the bit lines BL1 and BL2 at Vpp and open levels, respectively. In such a manner, only the memory transistor 1 is set such that the potentials of the control gate electrode and drain area thereof are simultaneously at Vpp level. As a result, a channel current is produced only in the memory transistor 1 to generate hot electrons at the end of the drain area thereof. The hot electrons are injected into the floating gate electrode of this memory transistor. Thus, the write operation will be performed relative to only the memory transistor 1. On the other hand, the other memory transistors 2-4 will not generate a channel current to make the write operation since the potentials of the control gate electrode and drain area are not simultaneously at Vpp level.

Next, the erase operation of the first embodiment will be described with reference to FIG. 2. The erase operation requires the erase signal that is set at H level. The clock gate type inverters 48 and 44 are turned off while the inverters 45 and 46 are turned on. When it is wanted to perform the erase operation to the memory transistors 1 and 2, the X-decoder circuit 218 sets the decoder signals DS1 and DS2 at L and H levels, respectively. As shown in FIG. 2, thus, the word lines WL1 and WL2 are set at GND and Vpp levels, respectively. Since the erase signal is at H level, the output of the interface circuit 120 becomes Vpp level. As a result, the source lines SL1 and SL2 will be set at Vpp and open levels, respectively, as shown in FIG. 2. The bit lines BL1 and BL2 are set at open level by the write/erase control circuit 219. Only in the memory transistors 1 and 2, thus, the potentials of the control gate electrodes and source areas are set at GND and Vpp levels, respectively. As a result, a tunnel current will be generated between the floating gate electrode and the source area. Electrons are then released from the floating gate electrode to the source area to perform the erase operation. On the other hand, the other memory transistors 3 generate a tunnel current to make the erase operation since the and 4 will not potentials of the control gate electrodes and source areas are at Vpp and open levels.

The read-out operation of the first embodiment will be described. The read-out operation requires the erase signal that is set at L, level. Thus, the source lines SL1 and SL2 are at GND level; the clock gate type inverters 43 and 44 are turned on; and the inverters 45 and 46 are turned off. When the bit lines BL1 and BL2 are placed at read-out potential and the decoder signal DSn to be selected is set at L, level in the above situation, the word line WLn is placed at H level to initiate the read-out operation.

According to the first embodiment of the present invention, the erase operation can be carried out relative to only the selected memory transistors 1 and 2. The other non-selected memory transistors 3 and 4 will not be subjected to the erase operation. The selection of the memory transistors is achieved by switching the word line signals to apply the high potential to the source areas of only the selected memory transistors.

Figure 13:
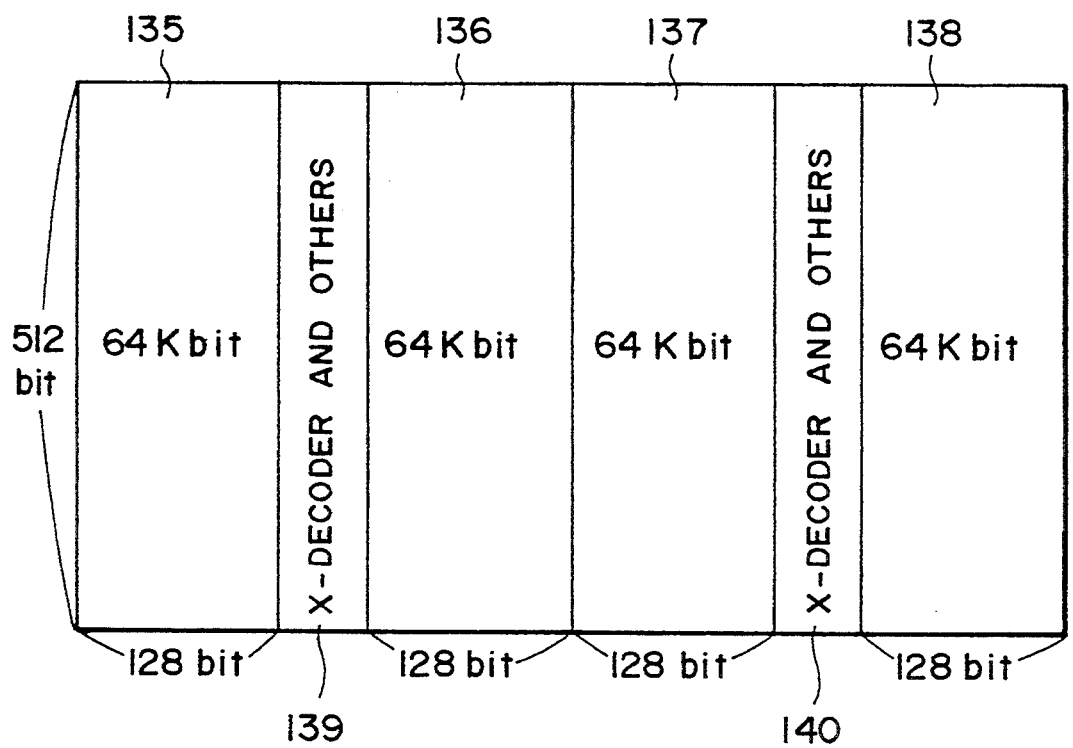
FIG. 13 is a schematic view illustrating the block layout of the memory section.

Therefore, the erase operation, which could only be carried out in the entire or block manner, can be performed for each word line at a time in accordance with the present invention. For example, if the memory part is of such a structure as shown in FIG. 13, the erasure can be carried out for 128 bits at a time. According to the first embodiment, further, the selection of range to be erased can be accomplished for a single word line as well as for a plurality or word lines. This is apparent from the fact that when both the decoder signals DS1 and DS2 are at L level in FIG. 1, all the memory transistors 1-4 can be subjected to the erasure. If the selection of range to be erased is made for 48 word lines at a time in the memory part of FIG. 13, the erase operation can be carried out for 512 bytes at a time. As a result, the first embodiment can provide a non-volatile semiconductor memory which is optimum to replace with magnetic disc, hard disc and the like that write or erase data as for 512 bytes at a time. In order to place a plurality of decoder signals at L, level, the X-decoder 218 may be constructed such that positive and negative logical signals AO and *AO inputted into the X-decoder at any address are selected together by the erase signal on the erase operation. Thus, the plurality of decoder signals can be placed together at L, levels on the erase operation.

Since the first embodiment enables the erase operation to be carried out for one or more word lines at a time as described, the problem of the prior art relating to the excess current produced when the erase operation was made in the entire or block manner can be avoided by the present invention. Therefore, the associated problems relating to change of threshold voltage Vth from the generation of a band-to-band tunneling, degradation of endurance, degradation of the data retention and so on can effectively be avoided. As a result, the memory transistors may very be improved in yield and reliability.

Figure 9:
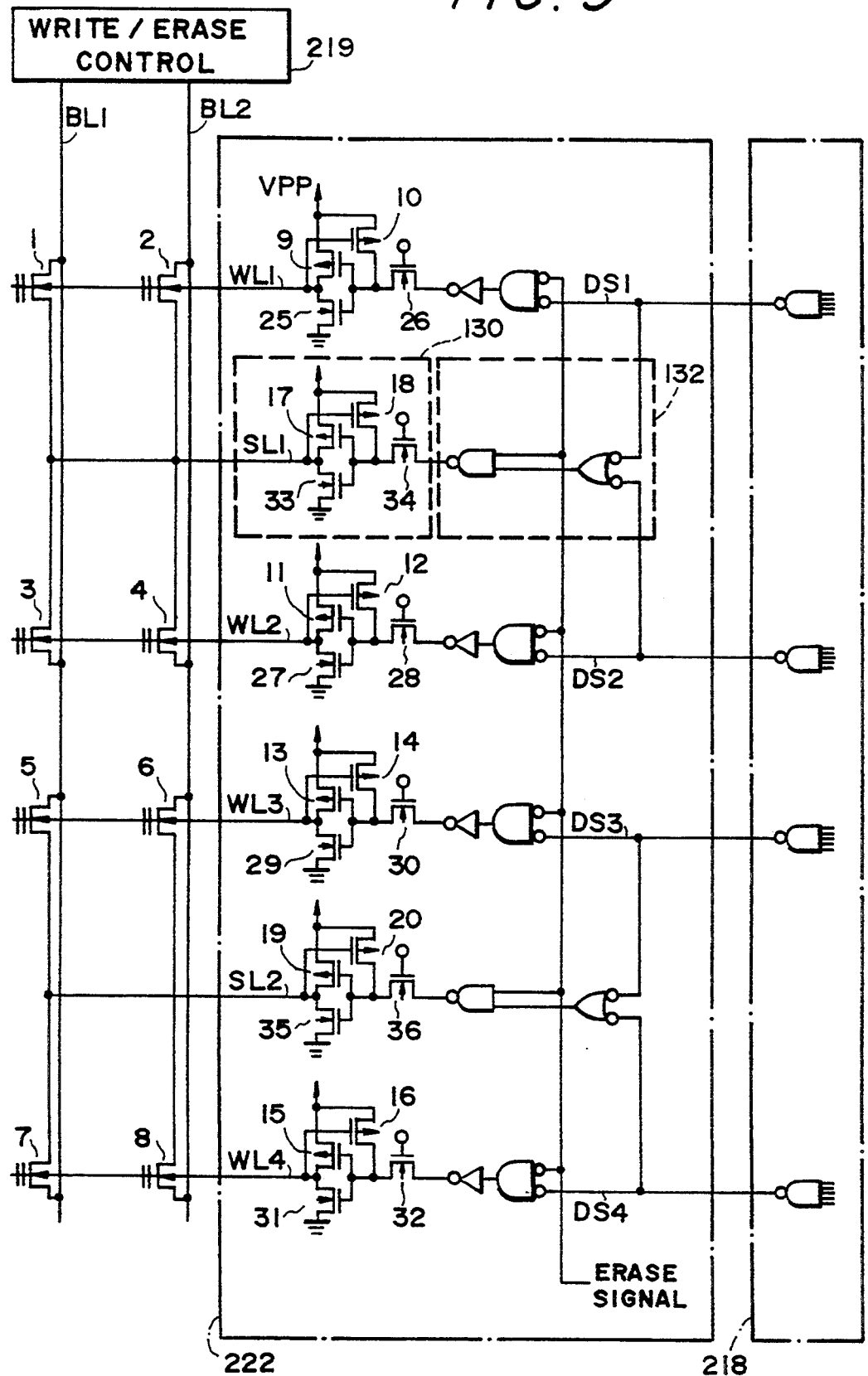
FIG. 9 is a circuit diagram illustrating the selection of a memory transistor wherein the erase operation is carried out by switching the decoder signal.

In the first embodiment, the selection of memory transistors is carried out by switching the word line signals. This enables the number of transistors used to reduce greatly, in comparison with such a circuit as shown in FIG. 9 and will be described later, which is adapted to perform the selection of transistors directly by switching the decoder signals DS1 and DS2. Moreover, the range of erasure can easily be determined for a plurality of word lines at a time.

More particularly, the first embodiment provides the interface circuit 120 that utilizes an inverted erase signal to provide a power supply of Vpp required by the erase operation. It is determined by switching the word line signals whether or not the power supply of Vpp is coupled to the source area of any desired memory transistor, that is, whether or not that memory transistor should be erased. For example, even if the range of erasure is to be determined for a plurality of word lines at a time, the interface circuit 120 can be used as a common power supply of Vpp.

On the contrary, such a circuit as shown in FIG. 9 must do the selection of memory transistors directly by switching the decoder signals DS1 and DS2 and then requires one interface circuit 130 for each word line. Therefore, the number of circuits increases much more than that of the first embodiment. It can be considered that the source line SL1 is shared by all the memory transistors 1-4 connected to the word lines WL1 and WL2 to prevent the above problem, as shown in FIG. 9. However, such an arrangement requires a logical circuit 132 as shown in FIG. 9. Eventually, such an idea cannot reduce the number of circuit parts. Particularly, if it is wanted to provide a system of performing the erase operation for 48 word lines at a time so that the erase operation can be made as for 512 bytes at a time, the logical circuit 132 may be much more complicated. On the contrary, the first embodiment will not induce such a problem and can provide a very superior system which can perform the erase operation for a plurality of word lines at a time with a reduced number of circuits.

(2) Second Embodiment

Figure 3:
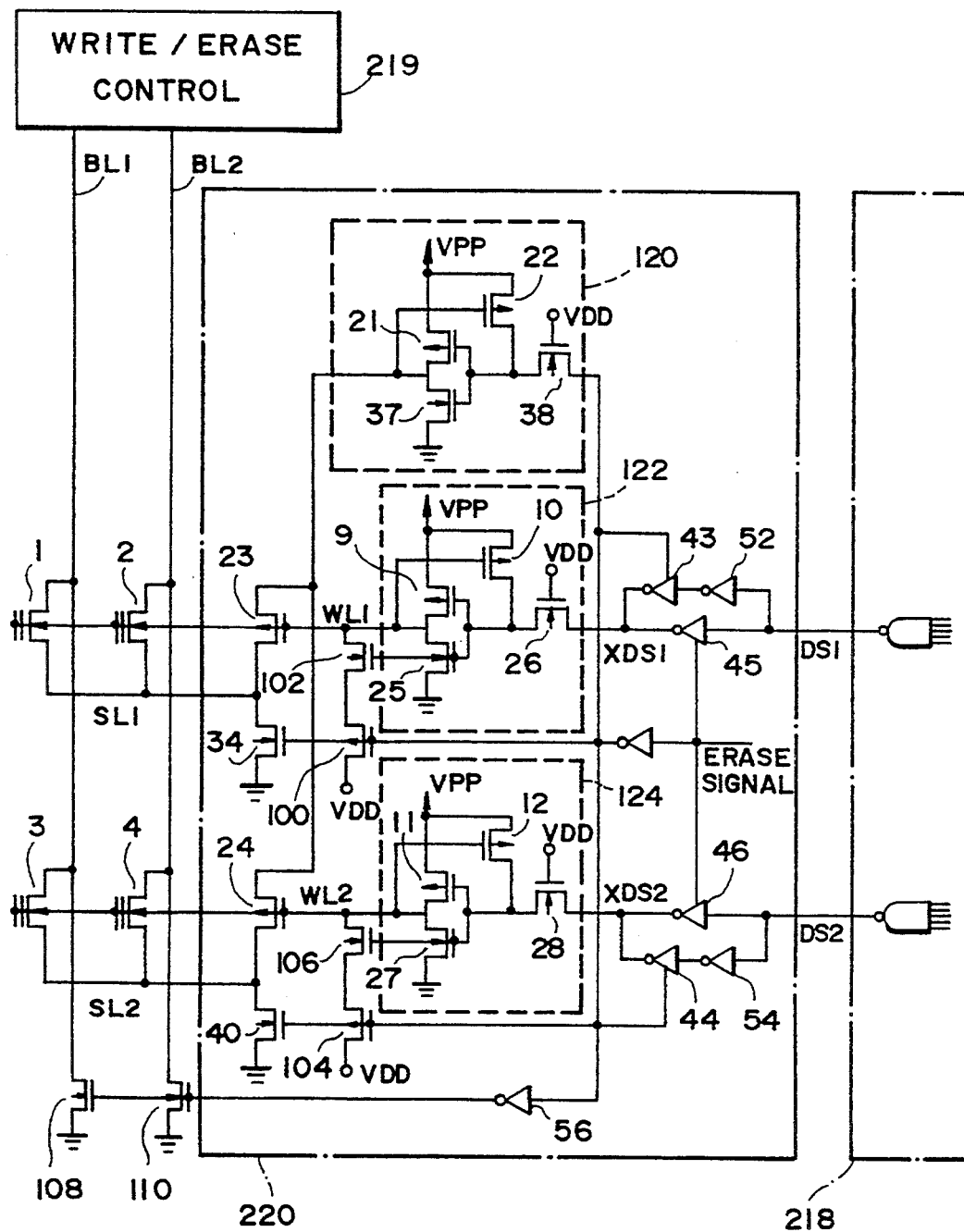
FIG. 3 is a circuit diagram of the second embodiment of a non-volatile semiconductor device constructed in accordance with the present invention.

Referring next to FIG. 3, there is shown the second embodiment of a non-volatile semiconductor device constructed in accordance with the present invention which is different from the first embodiment only in that the second embodiment comprises additional circuits of transistors (108, 110; 100, 102; 104, 106).

One circuit of transistors 108 and 100 functions to set the bit lines BL1 and BL2 at GND level on the erase operation. The other two circuits of transistors (100, 102; 104, 106) function to supply a constant voltage V1 to the respective one of the word lines WL1 and WL2 on the erase operation. The constant voltage V1 depends on the relationship in capability between the transistors (100, 102, 25) and the transistors (104, 106, 27). The second embodiment can automatically stop an erase operation for one or more word lines by detecting any memory transistor that has its threshold voltage lower than a predetermined value. Therefore, the dispersion of threshold voltage distribution can be reduced to avoid any overerasing effectively.

The operation of the second embodiment will be described with reference to the potential diagram of FIG. 4.

Figure 4:
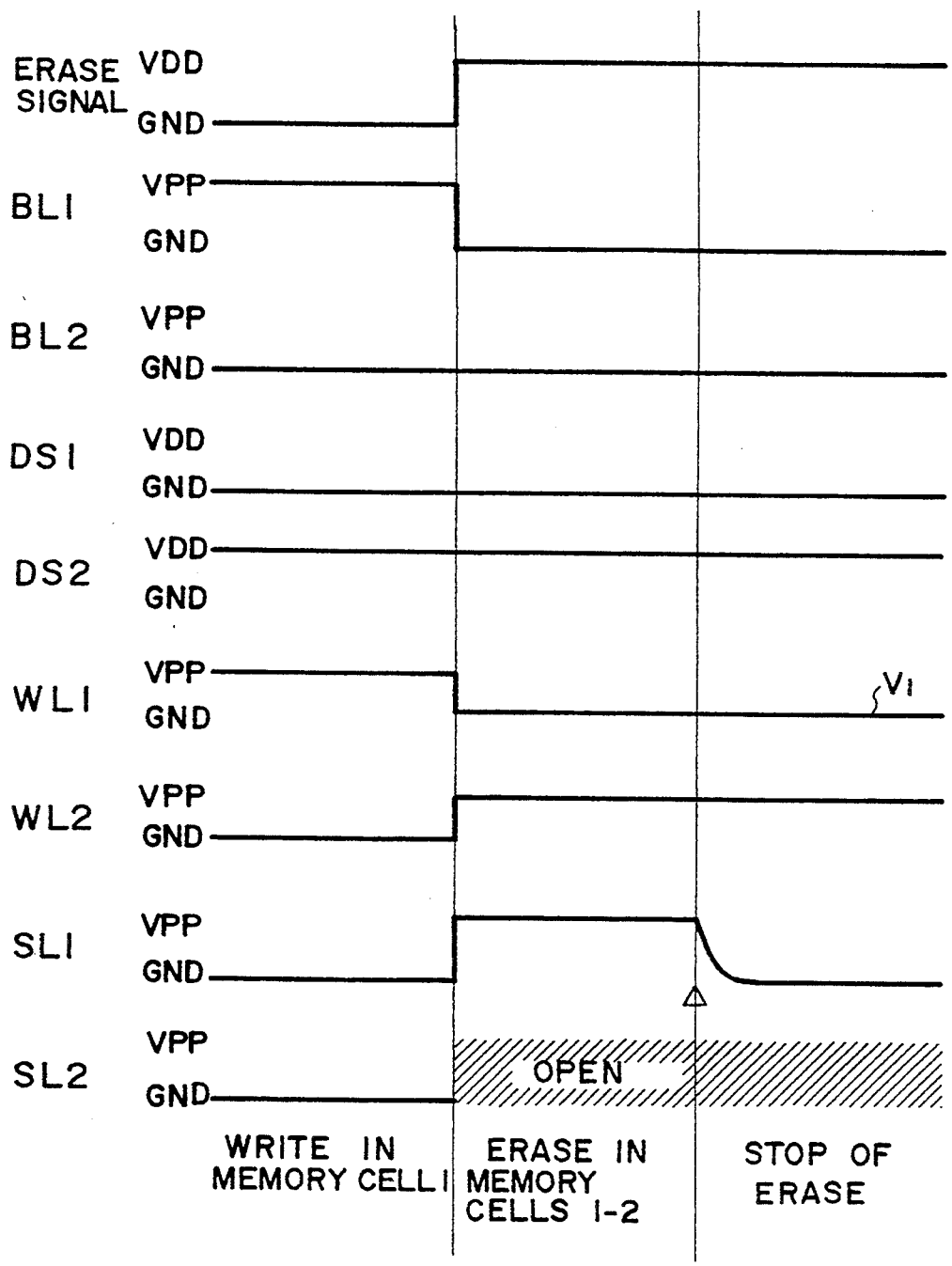
FIG. 4 is a potential diagram illustrating the operation of the second embodiment.

The write operation is similar to that of the first embodiment when the erase signal is set at L level, as shown in FIG. 4. In such a case, the transistors 108 and 110 are in their OFF state and the bit lines BL1 and BL2 will not be set at GND level. The transistors 100 and 104 are also in their OFF state and the constant voltage V1 to the word lines will not be set.

The erase operation requires that the memory transistors have previously been subjected to the aforementioned write operation. Next, the erase signal is set at H level, as shown in FIG. 4. Thus, the clock gate type inverters 48 and 44 are turned off while the inverters 45 and 46 are turned on. Further, the transistors 100, 104, 108 and 110 are turned on while the transistors 34 and 40 are turned off. When the erase operation is to be carried out to the memory transistors in such a situation, the X-decoder 218 sets the decoder signals DS1 and DS2 at L, and H levels, respectively. The word lines WL1 and WL2 are thus respectively set at a constant voltage V1 and Vpp level, depending on the capability of the transistors 25, 100 and 102, as shown in FIG. 4. It is preferred that the constant voltage V1 is set sufficiently lower than the potential Vpp. Since the erase signal has been set at H level, the output of the interface circuit 120 will be at Vpp level. As a result, the source lines SL1 and SL2 will be respectively set at Vpp and open levels. Furthermore, the bit lines BL1 and BL2 are set at such a state as they will not be supplied with any potential from the write/erase control circuit 219. Under such a condition, the control gate electrodes of the memory transistors 1, 2 are at the potential V1 while the source areas thereof are at Vpp level. Thus, a tunnel current will be produced between the floating gate electrode and the source area in each of the memory transistors. As a result, electrons are released from the floating gate electrode to the source area to perform the erase operation.

As the erase operation proceeds, the threshold voltage Vth in the memory transistors 1 and 2 gradually decreases. It is assumed at this time that the potential of the bit line BL1 or BL2 is V2 and the increase of the threshold voltage associated with the body effect of the memory transistor is V3. As aforementioned, the potential V1 has been applied to the control gate electrodes of the memory transistors 1 and 2. Therefore, the memory transistors will be turned on when the threshold voltage Vth becomes lower than $(V1-V2-V3)$. At this time, the current supply capability of the transistor 23 has been set sufficiently lower than those of the memory transistors 1, 2 and transistors 108 and 110. When either of the memory transistor 1 or 2 is turned on, thus, the potential of the source line SL1 is dragged to the side of GND level through the Nch transistor 108 or 110, as shown in FIG. 4. As a result, the potential of the source line SL1 is further reduced. Therefore, the tunnel current between the floating gate electrode and the source area in that memory transistor is also reduced. Eventually, the erase operation will be stopped.

In the second embodiment, the potentials V2 and V3 can be considered to be zero since the potential V2 is sufficiently low. If the current supply capability in the Nch transistors 25 and 102 is set to be sufficiently higher than that of the Pch transistor 100, the potential V1 may be set to be equal to 1.0 volt. Thus, the erase operation will be stopped at time when the threshold voltage Vth of the memory transistor becomes lower than 1.0 volt. This prevents the overerasing.

Figure 5:
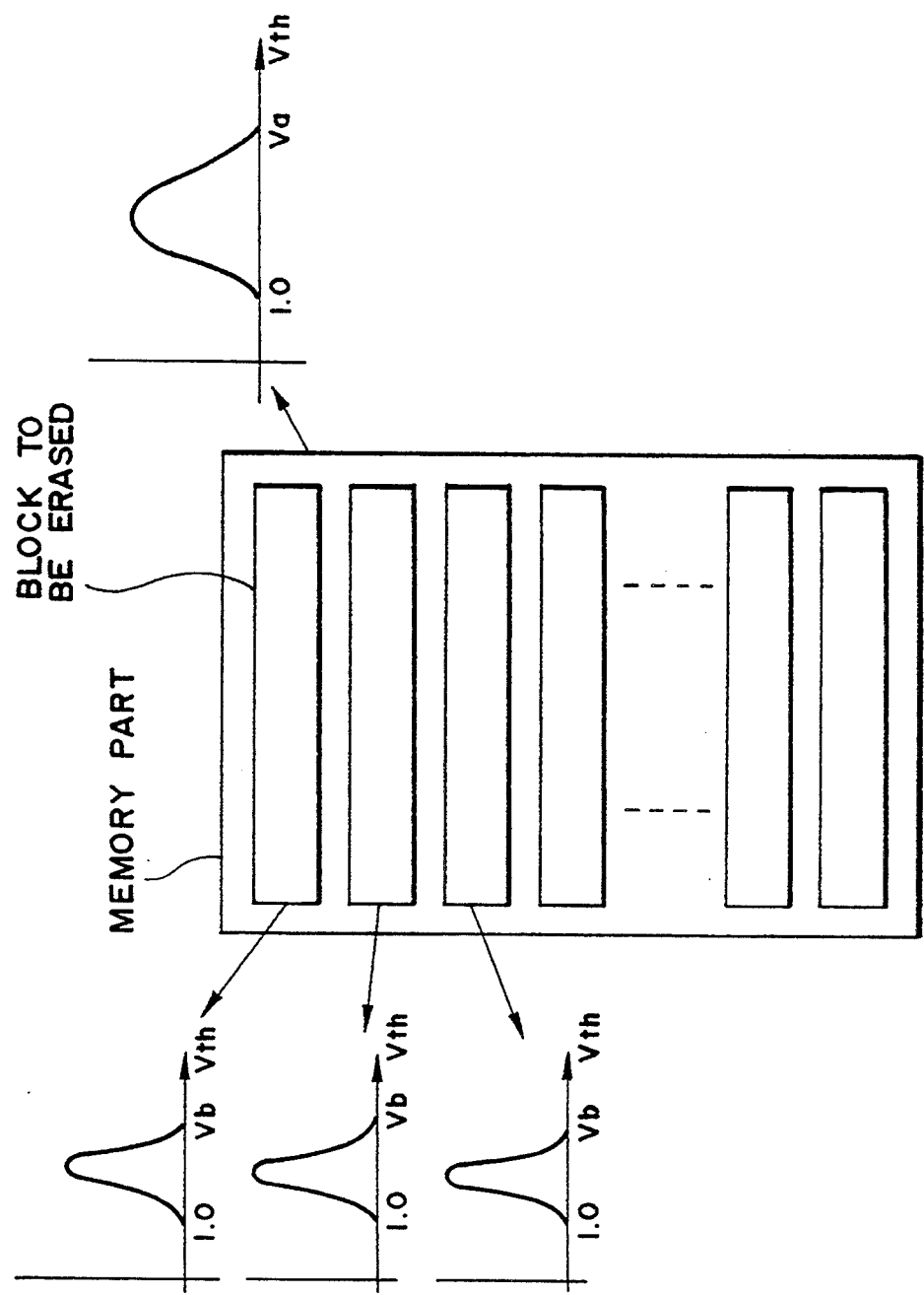
FIG. 5 is a schematic view illustrating the distribution of threshold voltage.

In addition to the erase operation for one or more word lines at a time, the second embodiment can stop the erase operation relative to all the memory transistors within such a range of erasure when one of, the memory transistors within the range of erasure that has the minimum threshold voltage is detected. Thus, the second embodiment can not only effectively prevent the overerasing, but also greatly reduce the dispersion of threshold voltage distribution in the memory transistors after stoppage of the erase operation, in comparison with the erase operation carried out in the entire or block manner. This is shown in FIG. 5. It is now assumed that the distribution of threshold voltage after stoppage of the erase operation through the entire memory part ranges between 1.0 volt and Va volts, as shown in FIG. 5. Since the erase operation for one or more word lines at a time can be carried out and stopped in the second embodiment, the distribution of threshold voltage after stoppage of the erase operation can range between 1.0 volt and Vb volts (Vb<Va). As a result, the stability in the read-out operation can be improved to increase the lower limit of operational margin. More particularly, as the dispersion of threshold voltage distribution in the memory transistors is reduced, the fluctuation of current through the memory transistors can also be reduced to suppress the fluctuation of read-out speed. This improves the stability in the read-out operation. Since the maximum threshold voltage among the fluctuated threshold voltage of the memory transistors (which corresponds to Vb in FIG. 5) can be suppressed lower, the source voltage in the read-out operation can also be suppressed lower to increase the lower limit of operational margin. This in turn enables the potential required to stop the erase operation (which is equal to 1.0 volt in FIG. 5) to set at a higher level. As a result, the second embodiment can provide an overerasing preventing means which can operate more steadily and reliably.

In addition to the provision of a superior overerasing preventing means, the second embodiment is characterized by that its circuitry is very simple with less parts. More particularly, the additional parts in the second embodiment include only the transistors 100, 102, 104, 106, 108 and 110, one for every bit line and two for every word line. Therefore, the transistors can be arranged with the minimum pitch depending on the pitch between each pair of adjacent memory transistors. The chip area can effectively be prevented from increasing.

In the second embodiment, as either of the memory transistor 1 or 2 is turned on, the potential of the source line SL1 is immediately dragged to GND level to stop the erase operation. Thus, time from the detection of, the memory transistor in the ON state until the stoppage of the erase operation becomes very short, with an improved sensitivity or detection. As a result, the overerasing can more reliably be prevented to greatly improve margins in design and process.

Figure 6:
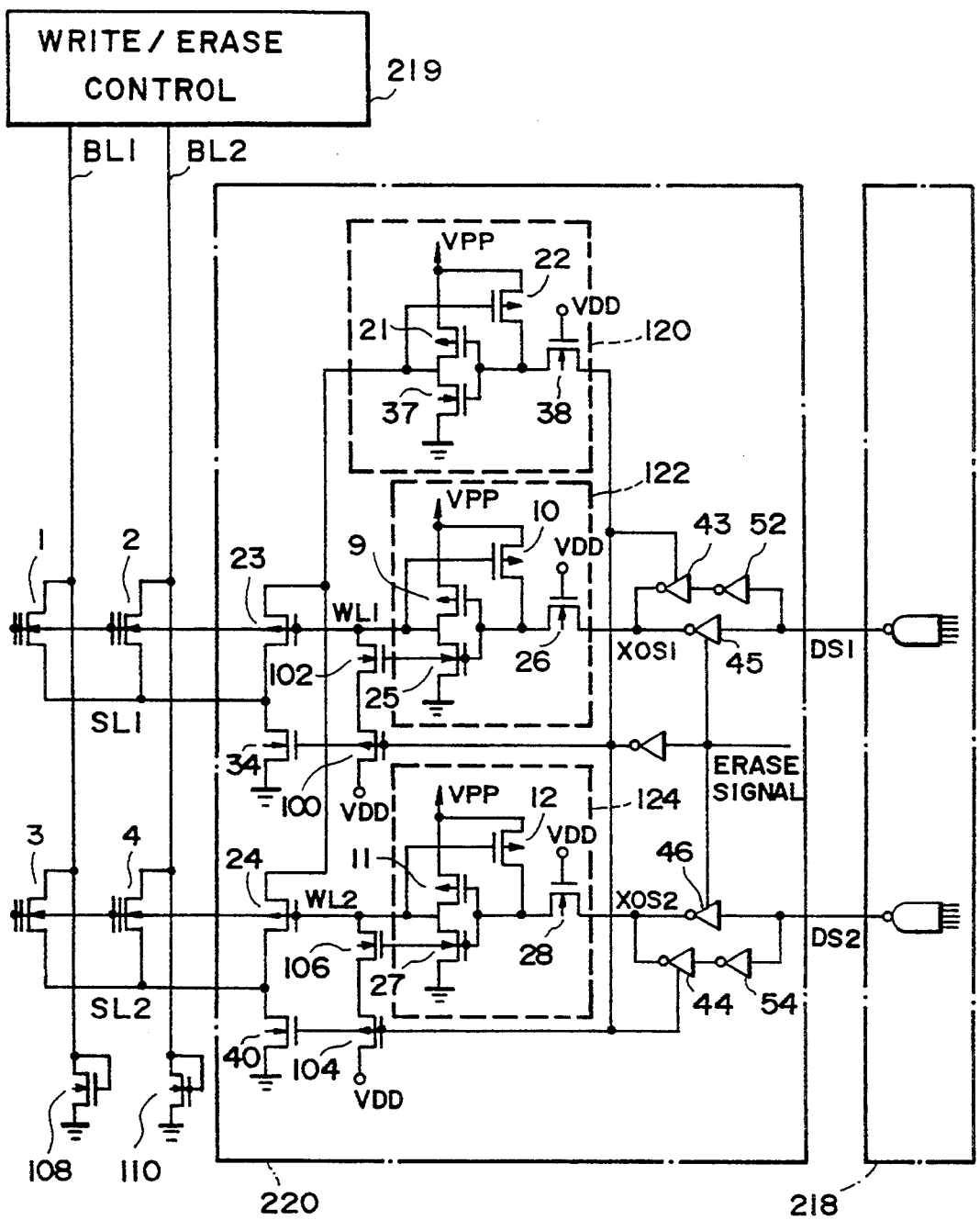
FIG. 6 is a circuit diagram illustrating a modification of the second embodiment wherein a different potential is applied to the drain area of the memory transistors.

Although the second embodiment has been described as to the detection of threshold voltage by applying the GND potential to the drain areas of the memory transistors 1–4, the present invention is not limited to such an arrangement, but may use the value of V2 other than the GND level. For example, if such a circuit as shown in FIG. 6, that is, a circuit having a diode connection to the Nch transistors 108 and 110 is used in the second embodiment, a potential increased by the threshold voltage of the Nch transistors will be applied to the drain areas of the memory transistors. The value represented by $Vth=V1-V2-V3$ is thus reduced. The threshold potential required to stop the erase operation can be set lower. This enables the range between 1.0 volt and Vb volts in FIG. 5 to be shifted downwardly to improve the lower limit of operational margin. As a result, for example, the second embodiment can deal with the reduction, of power supply voltage in the memory transistors. Particularly, the increase of the threshold voltage in such a case depends on the threshold voltage in the Nch transistors 108 and 110. Therefore, the adaptability to variations in the process can be maintained between the N type memory transistors 1-4 and the Nch transistors 108, 110. The second embodiment can provide a threshold voltage detecting means which can be steady for variations in the process. Furthermore, this enables any control of erase signal to be omitted and can provide a more simplified circuit structure.

Figure 7:
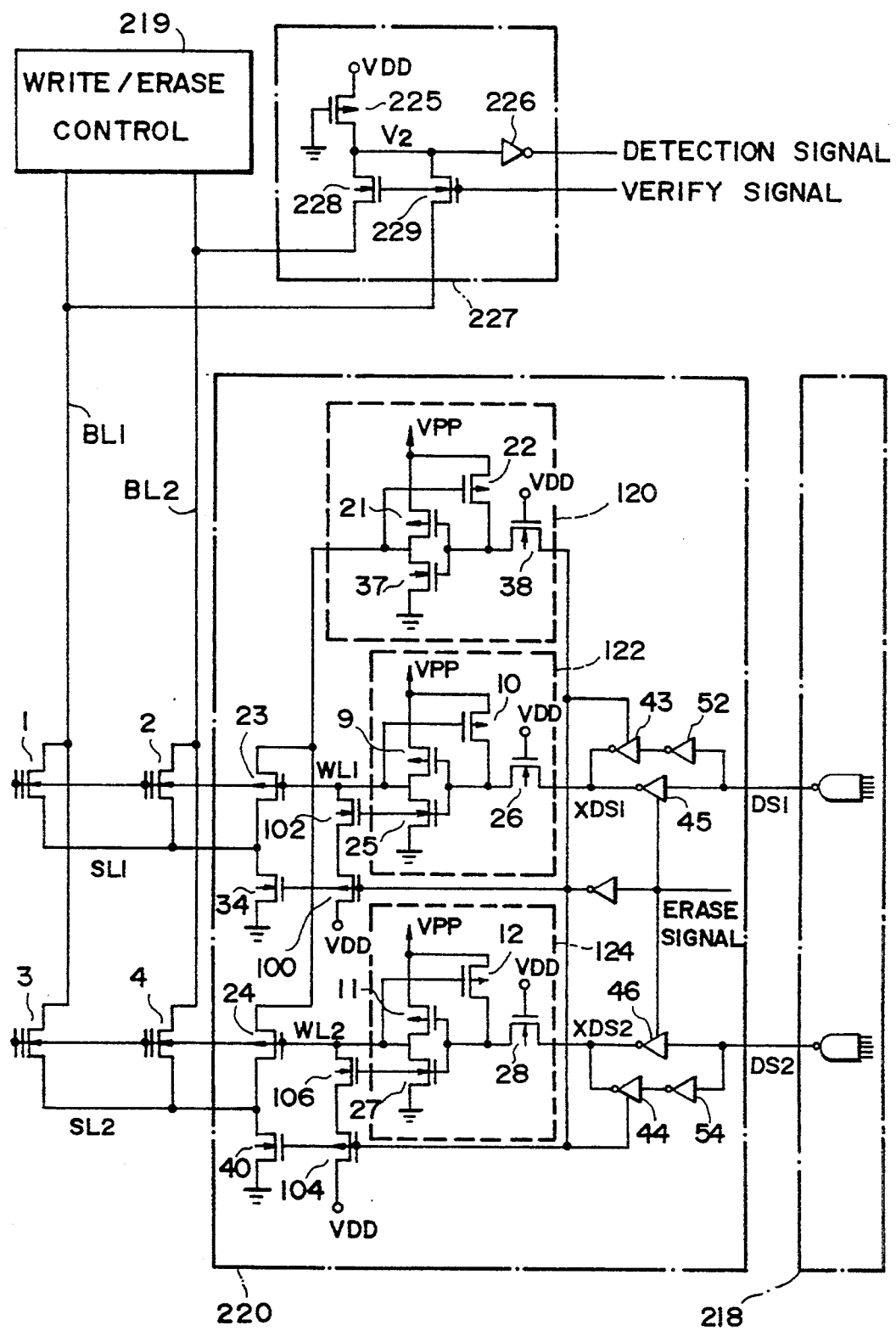
FIG. 7 is a circuit diagram of the third embodiment of a non-volatile semiconductor device constructed in accordance with the present invention.

The means for detecting the threshold voltage in the memory transistors is not limited to one shown in FIG. 3, but may be replaced by any other suitable means. For example, the system may include a threshold voltage detecting means for detecting the potentials in the bit lines BL1 and BL2 on the erase operation when the memory transistors are turned on and the potentials in the bit lines BL1 and BL2 reach a predetermined level. A detection signal from the detecting means is used to change the erase signal to L level whereat the erase operation will be stopped. The threshold voltage detecting means may be in the form of a threshold voltage detector 227 as shown in FIG. 7 and will be described later.

The means for detecting the threshold voltage in the memory transistors may be adapted to detect the threshold voltage by detecting currents flowing through the bit lines BL1 and BL2 when the memory transistors are turned on. After the detection, a detection signal is used to change the erase signal to L level and to stop the erase operation, as described. (3) Third Embodiment FIG. 7 shows the third embodiment of a non-volatile semiconductor device constructed in accordance with the present invention, which is different from the first embodiment of FIG. 1 only in that the third embodiment newly includes a threshold voltage detecting circuit 227 comprised of transistors 225, 228 and 229 and an inverters 226, and circuits for generating a constant voltage V1, each of these circuit comprising transistors (100, 102; 104, 106).

After the erase operation, the third embodiment verifies to check how much the threshold voltage of the memory transistor is reduced. Thus, the threshold voltage of the memory transistor can be maintained at a proper level. For example, an erase operation that is weak sufficiently not to raise a radical reduction in the threshold voltage and the verifying operation may alternately be repeated. When a detection signal is changed to another detection signal and if the erase operation is stopped, the set threshold voltage can more reliably be secured with more reliable prevention of the overerasing. The operation of the third embodiment will be described with reference to the potential diagram of FIG. 8.

Figure 8:
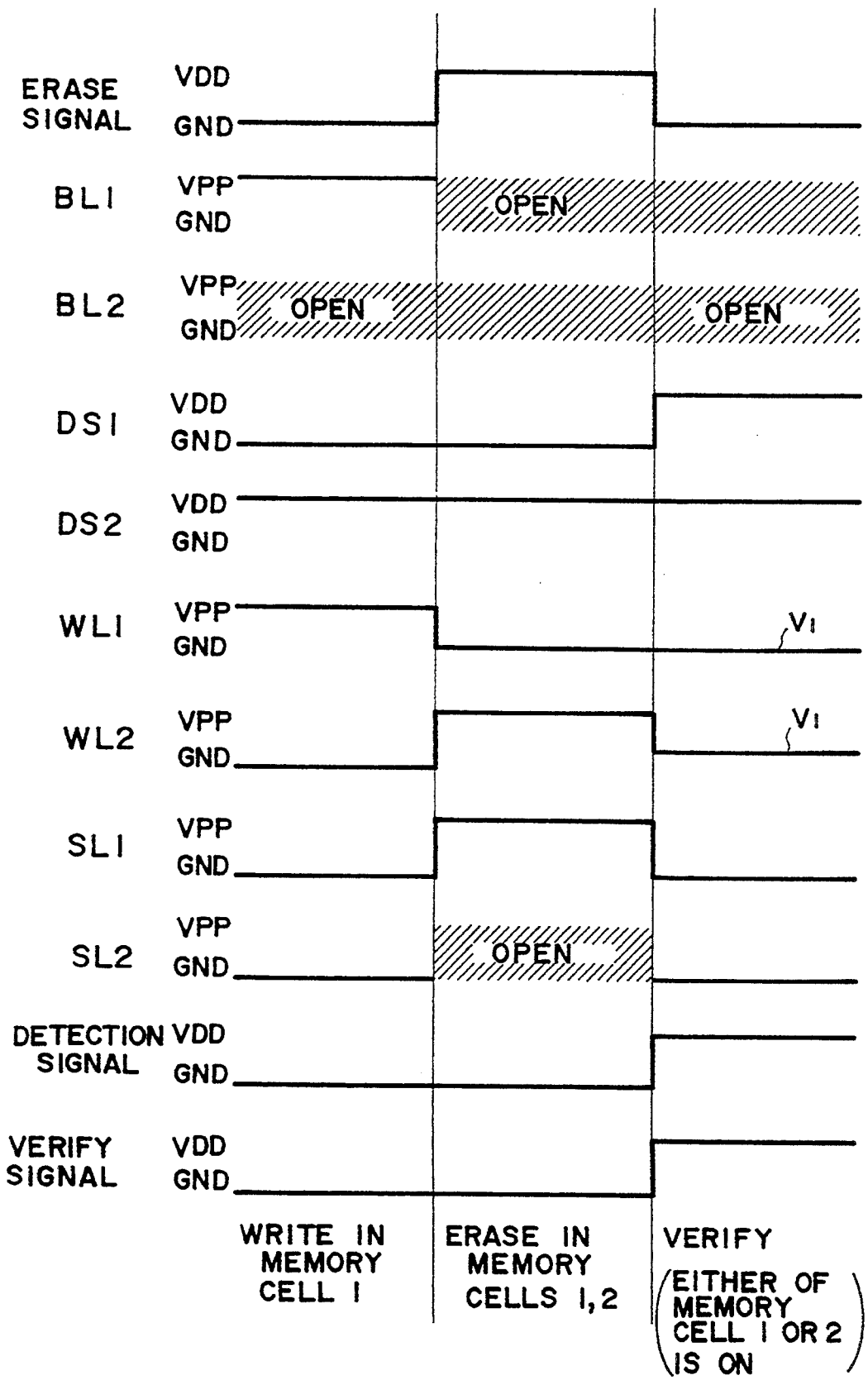
FIG. 8 is a potential diagram illustrating the operation of the third embodiment.

The write operation is carried out in the same manner as in the first embodiment when the erase and verify signals are placed at L, level, as shown in FIG 8.

The erase operation is also carried out in the same manner as in the first embodiment when the erase and verify signals are set at H and L, levels, respectively. However, the third embodiment is different from the first embodiment in that the third embodiment may perform a weak erase operation that will not raise any radical reduction in the threshold voltage. During each weak erase operation, the verify operation is carried out to check how much the threshold voltage in the memory transistor is reduced. This enables the overerasing to be avoided.

The verify operation first requires to set the erase and verify signals at L and H levels, respectively, as shown in FIG. 8. The Nch transistors 34 and 40 are turned on to place the source lines SL1 and SL2 at GND level. The clock gate type inverters 43 and 44 are turned on while the inverters 45 and 46 are turned off. Further, the Nch transistors 228 and 229 are turned on. Under such a condition, the X-decoder circuit 218 places both the decoder signals DS1 and DS2 at H level. The word lines WL1 and WL2 are thus set at a constant voltage (e.g. 1.0 volt). The write/erase control circuit 219 is set at such a state that it will not supply any potential to the bit lines BL1 and BL2. Since the source line SL1 is at GND level and the word line WL1 is at 1.0 volt, the memory transistors 1 and 2 will be turned off if the threshold voltage is equal to or higher than 1.0 volt. As a result, the potential V2 in the threshold voltage detecting circuit 227 is placed at it level by pulling-up or the Pch transistor 225, and the detection signal is placed at L, level.

On the other hand, if the threshold voltage in either of the memory transistor 1 or 2 is lower than 1.0 volts, that memory transistor is turned on. In such a case, the current supply capability of the transistor 225 has been set such that it will be sufficiently lower than those of the transistors 228, 229 and 34. Thus, the potential V2 in the threshold voltage detecting circuit 227 is placed at L level, its detection signal being placed at H level, as shown in FIG. 8. As the detection signal is shifted from L level to H level, the threshold voltage detecting circuit 227 will be able to detect the threshold voltage of the memory transistor. If the arrangement is such that the subsequent erase operation will not be carried out by such a detection signal, the threshold voltage can be set within a proper range and the overerasing can be avoided.

As will be apparent from the above description, the third embodiment can not only perform an erase operation within a range of one or more word lines at a time, but also verify and detect one of the memory transistors within such a range that has the minimum threshold voltage. As described in connection with FIG. 5, this can greatly reduce the dispersion of threshold voltage distribution in the memory transistors after stoppage of the erase operation, in comparison with the erase operation in the entire or block manner. Thus, the stability in the readout operation can be improved to increase the lower limit of operational margin. This also provides an overerasing preventing means which is more stable and reliable in operation.

The present invention is not limited to the aforementioned embodiments, but may be carried out in any one of various modified and changed forms within the scope of the invention.

Although the second and third embodiments have been described as the selection of a memory transistor to be erased by switching the word line signals, the present invention may be applied to an arrangement provided by modifying the word line control circuit as shown in the second or third embodiment into such a structure as shown in FIG. 9. In the word line control circuit 222 shown in FIG. 9, the selection of a memory transistor to be erased will be carried out directly by switching the decoder signals DS1-DS4.

Figure 10A:
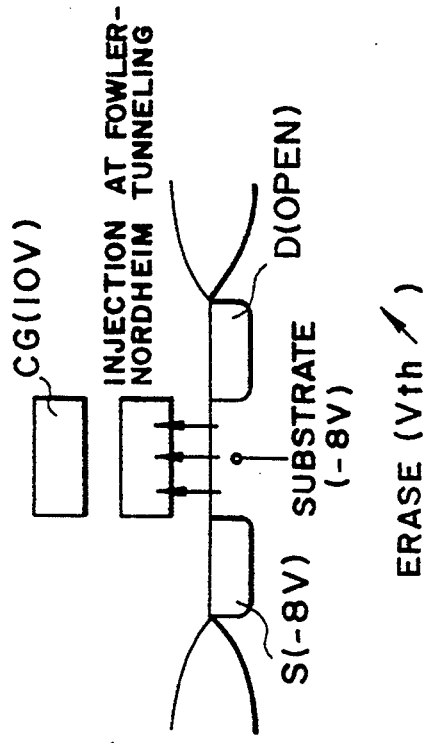
FIGS. 10A, 10B, 10C and 10D are cross-sectional views, each of which illustrates a memory transistor when the other write/erase operation is carried out.
Figure 10B:
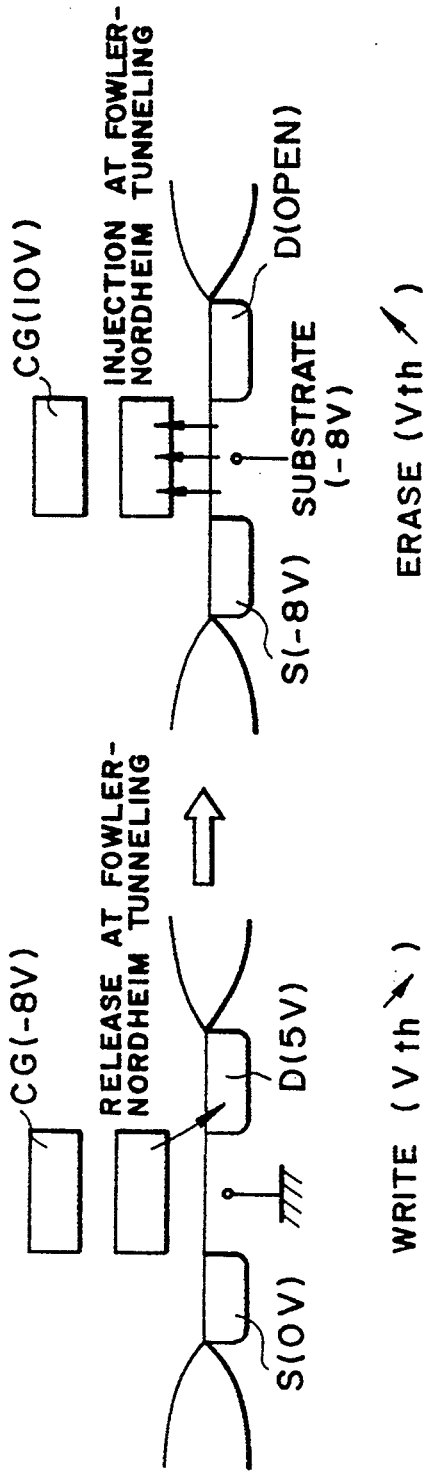
Figure 10C:
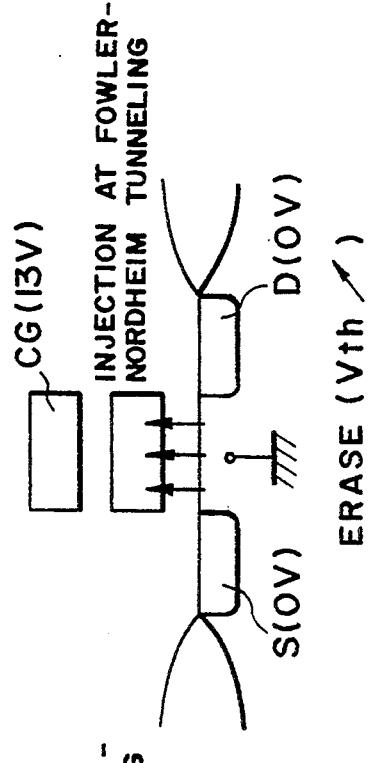
Figure 10D:
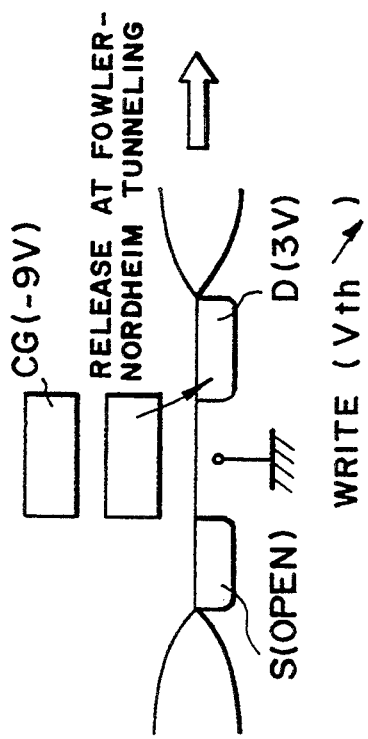
Figure 11:
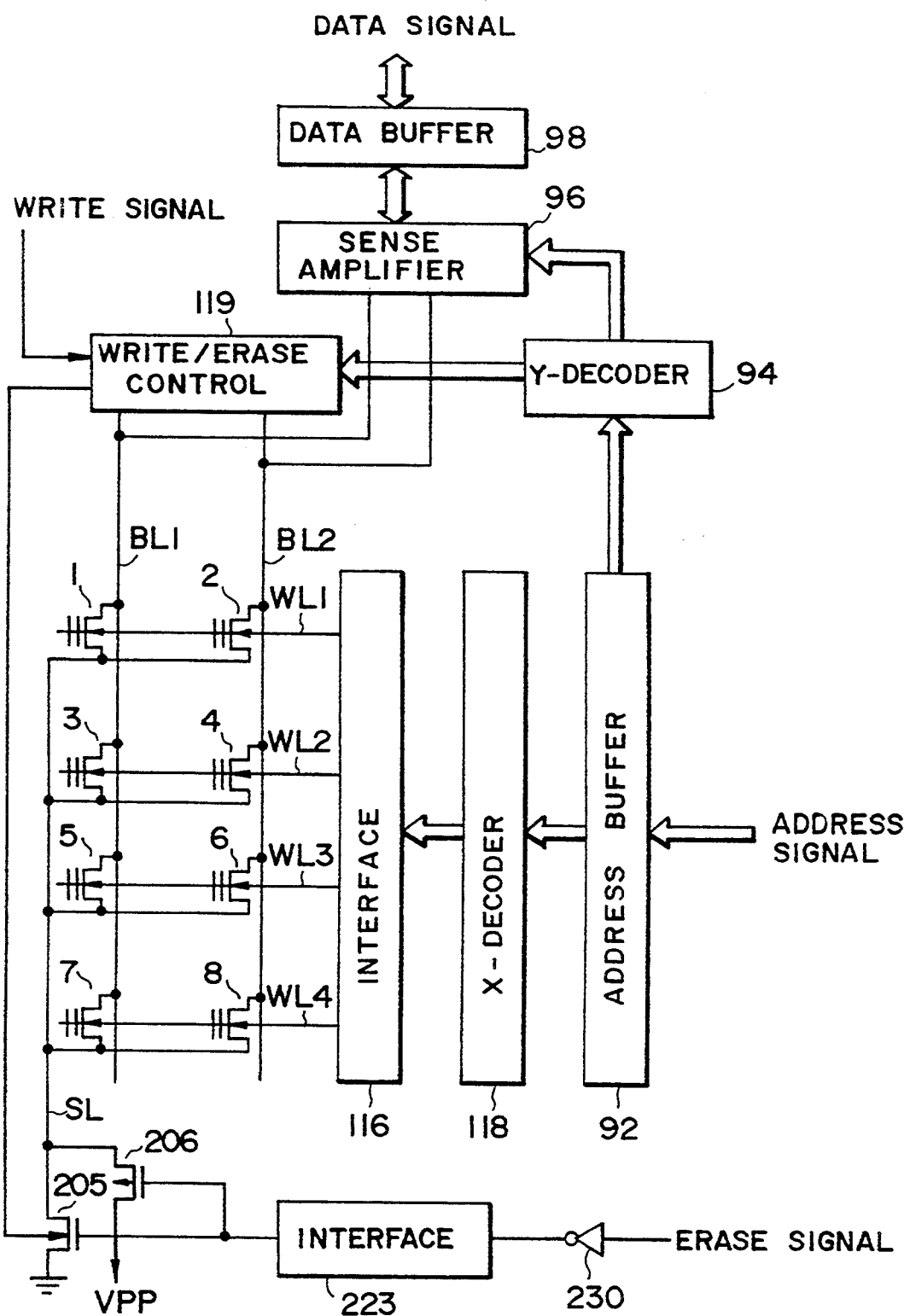
FIG. 11 is a circuit diagram illustrating a non-volatile semiconductor device constructed in accordance with the prior art.
Figure 12:
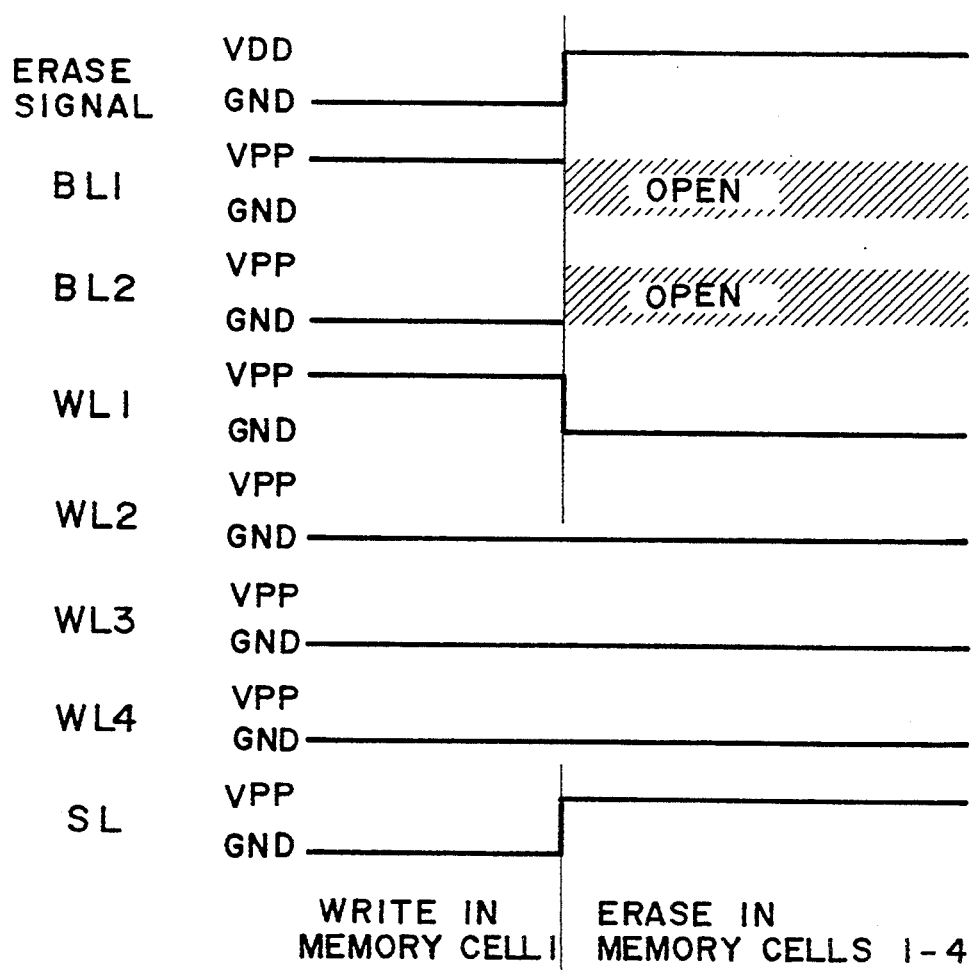
FIG. 12 is a potential diagram illustrating the operation of the non-volatile semiconductor device of the prior art shown in FIG. 11.

Although the present invention has been described as to the injection of hot electrons into the floating gate electrode on the write operation and also the release or electrons due to the tunnel current on the erase operation, the present invention is not limited to such a manner, but may be applied to any one of the other memory cells that can adjust the threshold voltage by release or injection of electrons relative to the floating gate electrode thereof, independently of hot electrons or tunnel current. In the write/erase operation, the release and injection of electrons may be performed relative to any one of the drain area, source area and semiconductor substrate. For example, the present invention may be applied to such an arrangement as shown in FIGS. 10A, 10B or 10C, 10D. In FIGS. 10A and 10C, the write operation is carried out by releasing electrons into the drain area under the action of tunnel current. In FIGS. 10B and 10D, the erase operation is performed by injecting electrons from the semiconductor substrate under the action of tunnel current.

I claim:

1. A non-volatile semiconductor device, comprising:
a plurality of memory transistors arranged in a matrix having a plurality of groups, each group containing a plurality of said memory transistors, each of said plurality of memory transistors having a floating gate electrode, a control gate electrode connected to one of a plurality of word lines, a first diffusion region coupled to one of a plurality of first lines, and a second diffusion region coupled to one of a plurality of second lines, one of said plurality of word lines and one of said plurality of first lines being connected to a plurality of the memory transistors contained in each of said groups so that said memory transistors in each of said groups are connected to a common one of said plurality of word lines and to a common one of said plurality of first lines, said common word line and said common first line being different for each group; and
electron release means for causing release of electrons from said floating gate electrode of the memory transistors of at least one selected group of said plurality of groups of memory transistors by applying a potential difference between the common word line and the common first line of the at least one selected group of said plurality of groups of memory transistors.

2. The non-volatile semiconductor device of claim 1, wherein said electron release means comprises means for applying a first potential to the first diffusion region of the memory transistors of said at least one selected group of memory transistors, said at least one selected group of memory transistors selected by switching of at least one of a plurality of word line signals on at least one of the plurality of word lines, the first potential being greater than a potential of the control gate electrode of the memory transistors of said at least one selected of memory transistors.

3. The non-volatile semiconductor device of claim 1, wherein said electron release means comprises means for applying a first potential to the first diffusion region of the memory transistors of said at least one selected group of memory transistors, said at least one selected group of memory transistors selected by switching of at least one of a plurality of decoder signals used for generating word line signals, the word line signals on at least one of the plurality of word lines, the first potential being greater than a potential of the control gate electrode of the memory transistors of said at least one selected group of memory transistors.

4. A non-volatile semiconductor device, comprising:
a plurality of memory transistors arranged in a matrix having a plurality of groups, each group containing a plurality of said memory transistors, each of said plurality of memory transistors having a floating gate electrode, a control gate electrode connected to one of a plurality of word lines, a first diffusion region coupled to one of a plurality of first lines, and a second diffusion region coupled to one of a plurality of second lines, one of said plurality of word lines and one of said plurality of first lines being connected to a plurality of the memory transistors contained in each of said groups so that said memory transistors in each of said groups are connected to a common one of said plurality of word lines and to a common one of said plurality of first lines, said common word line and said common first line being different for each group;
electron release means for causing release of electrons from said floating gate electrode of the memory transistors of at least one selected group of said plurality of groups of memory transistors by applying a potential difference between the common word lines and the common first lines of the at least one selected group of said plurality of groups of memory transistors; and
electron release stopping means for detecting whether a threshold voltage of the memory transistors of said at least one selected group of memory transistors is below a predetermined level during said electron release and stopping the electron release caused by said electron release means when said threshold voltage of said at least one selected group of memory transistors falls below said predetermined level.

5. The non-volatile semiconductor device of claim 4, wherein said electron release means comprises means for applying a first potential to the first diffusion region of the memory transistors of said at least one selected group of memory transistors, said at least one selected group of memory transistors selected by switching of at least one of a plurality of word line signals on at least one of the plurality of word lines, the first potential being greater than a potential of the control gate electrode of the memory transistors of said at least one selected group of memory transistors.

6. The non-volatile semiconductor device of claim 4, wherein said electron release means comprises means for applying a first potential to the first diffusion region of the memory transistors of said at least one selected group of memory transistors, said at least one selected group of memory transistors selected by switching of at least one of a plurality of decoder signals used for generating word line signals, the word line signals on at least one of the plurality of word lines, the first potential being greater than a potential of the control gate electrode of the memory transistors of said at least one selected group of memory transistors.

7. The non-volatile semiconductor device of claim 4, wherein said electron release stopping means comprises:
means for applying a second potential to said second diffusion region the memory transistors of said at least one selected group of memory transistors, the second potential being greater than a potential of said control gate electrode of the memory transistors of said at last one selected group of memory transistors during electron release caused by said electron release means;

means for detecting whether said threshold voltage of the memory transistors of said at least one selected group of memory transistors is below said predetermined level; and means for stopping the electron release caused by said electron release means by turning on at least one of the memory transistors of said at least one selected group of memory transistors.

8. The non-volatile semiconductor device of claim 7, wherein said second diffusion region of each of the memory transistors of said at least one selected group of memory transistors is connected to one of a plurality of transistors detecting a threshold, said threshold detecting transistors being the same conductivity type as said memory transistors, wherein a voltage applied to the second diffusion region of the memory transistors of said at least one selected group of memory transistors depends on the threshold voltage of the connected one of the plurality of transistors detecting a threshold.

9. The non-volatile semiconductor device of claim 4, wherein said electron release stopping means detects whether said threshold voltage of the memory transistors of said at least one selected group of memory transistors is below said predetermined level by detecting a potential of said second diffusion region of each of the memory transistors of said at least one selected group of memory transistors during said electron release caused by said electron release means, said electron release stopping means stopping the electron release caused by said electron release means when said detected potential falls below a predetermined level.

10. The non-volatile semiconductor device of claim 4, wherein said electron release stopping means detects whether said threshold voltage of the memory transistors of said at least one selected group of memory transistors is below said predetermined level by detecting a current between said first and second diffusion regions of each of the memory transistors of said at least one selected group of memory transistors during said electron release caused by said electron release means, said electron release stopping means stopping the electron release caused by said electron release means when said detected current falls below a predetermined level.

11. A non-volatile semiconductor device, comprising:
a plurality of memory transistors arranged in a matrix having a plurality of groups, each group containing a plurality of said memory transistors, each of said plurality of memory transistors having a floating gate electrode, a control gate electrode connected to one of a plurality of word lines, a first diffusion region coupled to one of a plurality of first lines, and a second diffusion region coupled to one of a plurality of second lines, one of said plurality of word lines and one of said plurality of first lines being connected to a plurality of the memory transistors contained in each of said groups so that said memory transistors in each of said groups are connected to a common one of said plurality of word lines and to a common one of said plurality of first lines, said common word line and said common first line being different for each group;

electron release means for causing release of electrons from said floating gate electrode of the memory transistors of at least one selected group of said plurality of groups of memory transistors by applying a potential difference between the common word lines and the common first lines of the at least one selected group of said plurality of groups of memory transistors; and monitoring means for monitoring a threshold voltage of the memory transistors of said at least one selected group of memory transistors after electron release caused by said electron release means to prevent excessive electron release from said floating gate electrodes of the memory transistors of said at least one selected group of memory transistors.

12. The non-volatile semiconductor device of claim 11, wherein said electron release means comprises means for applying a first potential to the first diffusion region of the memory transistors of said at least one selected group of memory transistors, said at least one selected group of memory transistors selected by switching of at least one of a plurality of word line signals on at least one of the plurality of word lines, the first potential being greater than a potential of the control gate electrode of the memory transistors of said at least one selected group of memory transistors.

13. The non-volatile semiconductor device of claim 11, wherein said electron release means comprises means for applying a first potential to the first diffusion region of the memory transistors of said at least one selected group of memory transistors, said at least one selected of memory transistors selected by switching of at least one of a plurality of decoder signals used for generating word line signals, the word line signals on at least one of said plurality of word lines, the first potential being greater than a potential of the control gate electrode of the memory transistors of said at least one selected of memory transistors.

14. The non-volatile semiconductor device of claim 1, wherein said groups of memory transistors are rows of said memory transistors.

15. The non-volatile semiconductor device of claim 4, wherein said groups of memory transistors are rows of said memory transistors.

16. The non-volatile semiconductor device of claim 11, wherein said groups of memory transistors are rows of said memory transistors.

* * * * *